(12) United States Patent
Gordon et al.

(10) Patent No.: US 9,998,162 B2
(45) Date of Patent: Jun. 12, 2018

(54) SCALABLE STOCHASTIC SUCCESSIVE APPROXIMATION REGISTER ANALOG-TO-DIGITAL CONVERTER

(71) Applicant: Intel Corporation, Santa Clara, CA (US)

(72) Inventors: Eshel Gordon, Aloney Aba (IL); Sophia Maerkovich, Haifa (IL); Ofir Degani, Haifa (IL); Hasnain Lakdawala, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/282,622

(22) Filed: Sep. 30, 2016

(65) Prior Publication Data
US 2018/0097535 A1    Apr. 5, 2018

(51) Int. Cl.
| | | |
|---|---|---|
| H03M 1/00 | (2006.01) | |
| H03M 1/66 | (2006.01) | |
| H04B 1/16 | (2006.01) | |
| H03M 1/46 | (2006.01) | |
| H03M 1/10 | (2006.01) | |

(52) U.S. Cl.
CPC .......... H04B 1/16 (2013.01); H03M 1/1009 (2013.01); H03M 1/466 (2013.01)

(58) Field of Classification Search
CPC ........ H03M 1/04; H03M 1/403; H03M 1/466; H03M 1/687; H03M 1/806; H03M 1/145; H03M 1/148

USPC .......... 341/118, 120, 110, 126, 150
See application file for complete search history.

(56) References Cited

U.S. PATENT DOCUMENTS

| | | | | |
|---|---|---|---|---|
| 8,599,059 | B1* | 12/2013 | Chung | H03M 1/466 341/163 |
| 9,520,891 | B1* | 12/2016 | Kull | H03M 1/08 |
| 9,531,400 | B1* | 12/2016 | Wen | H03M 1/403 |
| 9,553,602 | B1* | 1/2017 | Wu | H03M 1/12 |
| 2011/0234433 | A1* | 9/2011 | Aruga | H01L 23/5223 341/172 |
| 2012/0025062 | A1* | 2/2012 | Neubauer | H03M 1/145 250/208.1 |
| 2012/0056770 | A1* | 3/2012 | Araki | H03M 1/466 341/172 |
| 2012/0326901 | A1* | 12/2012 | Zhao | H03M 1/0604 341/118 |
| 2013/0106629 | A1* | 5/2013 | Nys | H03M 1/144 341/110 |
| 2013/0169454 | A1* | 7/2013 | Debnath | H03M 1/145 341/110 |

(Continued)

*Primary Examiner* — Simon Nguyen
(74) *Attorney, Agent, or Firm* — Schwegman Lundberg & Woessner, P.A.

(57) ABSTRACT

Some embodiments include apparatuses and methods using capacitor circuitry to sample a value of an input signal; comparators to compare the value of the input signal with a range of voltage values and provide comparison results; successive approximation register (SAR) logic circuitry to generate first bits and second bits based on the comparison results; and circuitry to calculate an average value of a value of the second bits and a value of bits of a portion of the first bits, and to generate output bits representing the value of the input signal, the output bits including bits generated based on the average value.

21 Claims, 6 Drawing Sheets

100

(56) References Cited

U.S. PATENT DOCUMENTS

| | | | |
|---|---|---|---|
| 2014/0070970 A1* | 3/2014 | Jansson | H03M 1/1009 |
| | | | 341/120 |
| 2014/0232582 A1* | 8/2014 | Lian | H03M 1/1225 |
| | | | 341/158 |
| 2015/0061904 A1* | 3/2015 | Lee | H03M 1/1023 |
| | | | 341/118 |
| 2015/0091744 A1* | 4/2015 | Shen | H03M 1/04 |
| | | | 341/110 |
| 2015/0180498 A1* | 6/2015 | Yang | H03M 1/403 |
| | | | 341/120 |
| 2015/0263756 A1* | 9/2015 | Chiu | H03M 1/468 |
| | | | 341/118 |
| 2016/0182075 A1* | 6/2016 | Devarajan | H03M 1/1019 |
| | | | 341/120 |
| 2016/0373124 A1* | 12/2016 | Kijima | H03M 1/38 |

* cited by examiner

SCALABLE STOCHASTIC SUCCESSIVE APPROXIMATION REGISTER ANALOG-TO-DIGITAL CONVERTER

TECHNICAL FIELD

Embodiments described herein pertain to mixed-signal circuits. Some embodiments relate to analog-to-digital converters.

BACKGROUND

Analog-to-digital converters (ADCs) are widely used in electronic devices or systems such as cellular phones, tablets, computers, and many other electronic items. An ADC converts analog signals into digital signals (a combination of binary ones and zeros). An analog signal can be a signal obtained from antennae (e.g., in a wireless communication device), a microphone, or other sources. A successive approximation register (SAR) ADC is one of many types of ADCs. In some electronic devices or systems, designing an ADC, including SAR ADC, to meet overall operating criteria such as speed, noise tolerance level, and power consumption, may pose a challenge.

DETAILED DESCRIPTION

Wireless communications technologies such as WiGig and 5G employ wide bandwidth signals and complex modulation schemes. These technologies often demand low power consumption for use in mobile devices. This creates the need for ADCs that can convert signals in the GHz range with an effective resolution of 6 to 9 bits. To meet these demands, existing ADC topologies may need to overcome some design tradeoffs in order to achieve low power consumption.

Existing topologies such as Sigma Delta ADCs are usually unsuitable for wide bandwidth signals. Conventional Sigma Delta ADCs can convert signals up to few 100 MHz range. Beyond that range, the over-sampling ratio (OSR) is too small, making the Sigma Delta ADCs ineffective. Interleaving of Sigma Delta ADCs can be impractical due to the need to carry sensitive signals from converter to converter. Pipeline ADCs typically are power hungry due to the need to generate accurate analog residue in a short time. A variety of calibration schemes are attempted in order to overcome this issue. However, these schemes can be elaborate and complex. Flash converters are suitable for high speed, but they may be ineffective for resolutions of 6 bits and higher.

SAR converters are commonly used when speed and resolution are key factors due to their low power characteristics. However, many conventional SAR converters may demand a tradeoff between resolution and speed. Some conventional techniques try to increase ADC core resolution by interleaving more ADC cores. This can increase the interleaving overhead, leading to higher power consumption. Some other conventional techniques try to increase the core speed by using multi-bit per cycle (step). However, such techniques could trade off interleaving overhead for core power consumption. Another conventional approach to mitigating the different requirements between most significant bits (MSBs) and least significant bits (LSBs) steps involves using coarse front-end conversion followed by fine back-end ADC to resolve the LSBs. The coarse part is often designed for speed and the fine part for accuracy. This may give some relaxation in the speed/accuracy tradeoff, but it still remains very strong in the fine ADC. In some SAR ADC designs, the fine part is further interleaved, thereby adding complexity overhead and cost. Some other conventional approaches may employ stochastic methods. However, such approaches use it as a replacement for deterministic quantization.

The techniques described herein include a novel stochastic SAR ADC that can increase the effective resolution of the SAR ADC (e.g., by two bits or more) and have a smaller penalty in speed/power compared with conventional SAR ADCs. The described SAR ADC is flexible in trading resolution for speed by means of configuration. The SAR ADC described herein could be used to build a power efficient scalable interleaved converter with a minimal number of cores. The described SAR ADC can be suitable for many wireless communication components, including WiGig and 5G receivers.

Conventional SAR ADCs often demand the final accuracy in each of the conversion cycles (steps). Any digital-to-analog (DAC) settling error and/or comparator error in conventional SAR ADCs would be carried to the final output (e.g., output bits). Because the DAC voltage in typical SAR changes is much larger in the MSB steps than in the final steps, the first steps may need more time in order to meet the settling accuracy. Some conventional SAR ADCs may add additional schemes, such as redundancy, in the first steps in order to ease the settling requirements. However, if a single comparator is used, as in the case of many conventional SAR ADCs, it needs to accommodate the final accuracy even though it may only be required in the last steps. Tradeoff between comparator noise and speed for a given power consumption is well known. Some conventional techniques may try to modify comparator characteristics dynamically or use different comparators for coarse and fine steps. However, the tradeoff between accuracy and speed/power for the fine steps still remain and can add complexity to the circuit.

It is common in SAR ADC design to set the physical resolution (number of bits) close to the required effective resolution in order to minimize the number of cycles (steps) per conversion. This means that the budget for noise may become more stringent. In most cases, an implementation with finer quantization (which is limited by the noise) would be more efficient. For the medium resolution range (e.g., up to 10 effective bits), the KT/C noise could usually be sufficiently low (capacitor size would be larger due to other considerations). Thus, the dominant noise would be the comparator noise.

The SAR ADC in the techniques described herein includes a number (e.g., a cluster) of noisy but fast comparators, unlike some conventional SAR ADCs that use a single low-noise comparator. The described techniques exploit a feature such that when the comparator inputs are close to zero, they will give statistical information on the signal due to the presence of noise (this relies on the comparators having uncorrelated noise). The SAR ADC in the techniques described herein can repeat some comparison cycles (e.g., a last comparison cycle) one or more times to obtain additional information on the input. Unlike some conventional SAR ADCs, where all the comparators compare the input to zero, the comparators in the described SAR ADC gets different inputs (e.g., different voltages in a range of voltages). The different inputs are linearly spread around zero by interpolation of a capacitor array included in SAR ADC. The voltage difference between two capacitors is the "deterministic LSB" and is designed to be in the order of the noise sigma. Exact knowledge of the noise characteristics may not be required. The linear spread of the inputs creates a cumulative distribution function, which is almost linear with a known slope. This allows reconstruction of the signal (as described in more detail below) to be done with simple techniques, such as by averaging and addition to the MSBs with no or minimal noise dependant gain factor. During coarse steps where noise may not be an issue, the number of comparators can be used for multi-bit per cycle (per step) and/or some of the comparators can be turned off.

The SAR ADC, described in more detail below, includes a 2-bit per cycle SAR with multiple comparators (e.g., six comparators), preceded by coarse six levels quantization. The comparators can have much higher noise relative to the ADC signal-to-noise ratio (SNR). Thus, they can be made much faster. A single core using the SAR ADC described herein can operate at relative higher frequency (e.g., in the range of 660 MHz or higher) with a resolution of at least 7.5 effective number of bits (ENOB).

The described SAR ADC gives sufficient redundancy in the coarse steps to avoid any settling issues. A passive interpolation matrix of capacitor array is used to create the linearly spread inputs to the comparators. In the fine steps, the inputs of the comparators are in the order of the noise level. These fine steps can be repeated to achieve the desired resolution (with exponentially diminishing returns). The achieved resolution would be limited by the other non-idealities (e.g., KT/C noise). The number of comparators and the number of additional comparison cycles gives statistical approximation of the signal. The accuracy of this approximation depends not only on the number of comparisons but also on the level of the noise compared with the quantization LSB.

In sum, the SAR ADC described here can be relatively fast, scalable, and consume less power in comparison with some conventional SAR ADCs. Other improvements are described below.

Figure 1:
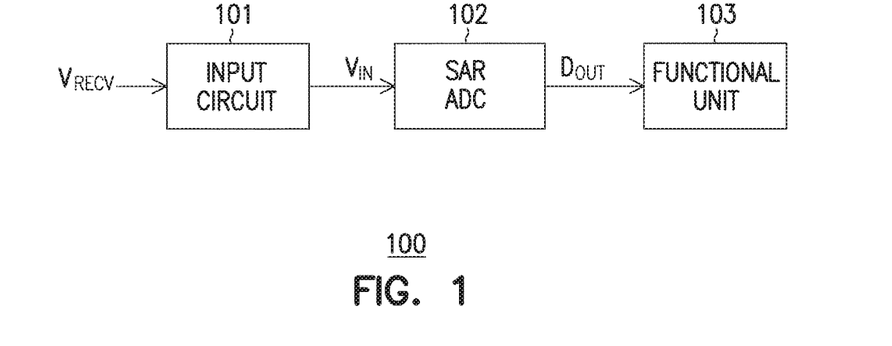
FIG. 1 shows an apparatus including an SAR ADC, according to some embodiments described herein.

FIG. 1 shows an apparatus 100 including an SAR ADC 102, according to some embodiments described herein. Apparatus 100 can include or be included in an electronic device or system, such as a processor (e.g., a general purpose processor or an application-specific integrated circuit (ASIC)), a system on chip (SoC), a wireless communication device (e.g., cellular phones), a tablet, a computer, or other electronic items or system. As shown in FIG. 1, apparatus 100 can include an input circuit 101 and a functional unit 103 coupled to SAR ADC 102. Input circuit 101 can operate to receive a signal (e.g., analog signal) $V_{RECV}$, which can be a signal derived from an antenna or from other signal sources. Input circuit 101 may include components, such as amplifier, filter, and other components to improve the quality of signal $V_{RECV}$. Input circuit 101 can generate a signal (e.g., input signal) $V_{IN}$ based on signal $V_{RECV}$. Signal $V_{IN}$ is an analog signal. SAR ADC 102 can operate to convert signal $V_{IN}$ into information (e.g., output information) $D_{OUT}$, which is a digital representation of signal $V_{IN}$. Information $D_{OUT}$ can include bits (e.g., a code). Input circuit 101 can provide information $D_{OUT}$ to functional unit 103 for further processing. SAR ADC 102 can include any of the SAR ADCs described below with reference to FIG. 2 through FIG. 6.

Figure 2:
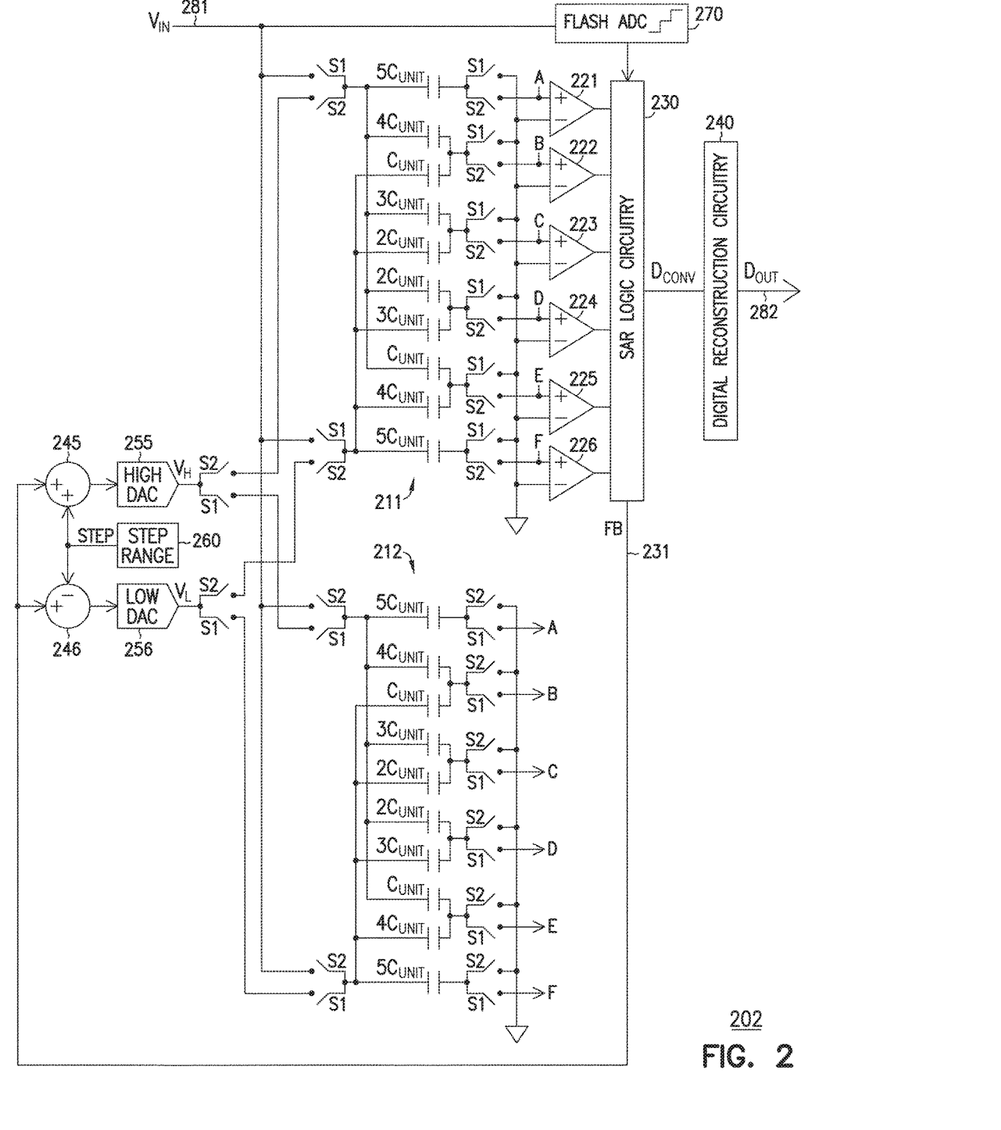
FIG. 2 shows a schematic diagram of an SAR ADC, according to some embodiments described herein.

FIG. 2 shows a schematic diagram of an SAR ADC 202, according to some embodiments described herein. SAR ADC 202 can correspond to SAR ADC 102 of FIG. 1. As shown in FIG. 2, SAR ADC 202 can include capacitor circuitry including capacitor arrays 211 and 212, comparator circuitry including comparators 221, 222, 223, 224, 225, and 226, an SAR logic circuitry 230, digital reconstruction circuitry 240, summation circuitry including summers 245 and 246, DAC circuitry including DAC 255 and 256, step range circuitry 260, a flash ADC 270, a switching network including switches S1 and S2, an input node 281, and an output node 282.

SAR ADC 202 can operate to receive a signal (e.g., input signal) $V_{IN}$ at input node 281 and generate information (e.g., output information) $D_{OUT}$ at output node 282. SAR ADC 202 can generate information $D_{OUT}$ by taking samples of signal $V_{IN}$, and then converting the value (analog value) of each of the samples into bits, which are provided as information $D_{OUT}$. The number of bits that represent the digital value for each sample of signal $V_{IN}$ is based on the resolution of SAR ADC 202.

The operations of SAR ADC 202 can include a sampling phase and a conversion phase. SAR ADC 202 can sample signal $V_{IN}$ during the sampling phase and convert the sampled information into information (e.g., converted information) $D_{CONV}$ during the conversion phase. Information $D_{CONV}$ is digital information that includes a number of bits (e.g., a code) representing the value of signal $V_{IN}$. However, in order to improve the accuracy of the conversion (e.g., to increase ENOB that presents each sample of signal $V_{IN}$), SAR ADC 202 further performs an averaging operation information $D_{CONV}$ and a reconstruction operation to generate information $D_{OUT}$. Thus, both information $D_{CONV}$ and information $D_{OUT}$ can represent digital information of signal $V_{IN}$. However, the averaging operation and the reconstruction operation performed by SAR ADC 202 (described in more detail below with reference to FIG. 5) can increase the ENOB for each sample of signal $V_{IN}$.

In FIG. 2, capacitor array 211 and capacitor array 212 are included in SAR ADC 202 to allow a time interleave of the sampling phase and the conversion phase (described below). This time interleave technique can improve (e.g., increase) the speed of SAR ADC 202. Further, each of capacitor array 211 and capacitor array 212 has a passive interpolation of capacitance values, such that each of capacitor arrays 211 and 212 can provide a linear input range (e.g., six linear ranges) to input nodes of comparators 221 through 226 during each comparison cycle within a conversion of each sample of signal $V_{IN}$. This interpolation can improve (e.g., increase) conversion accuracy of SAR ADC 202.

Figure 3:
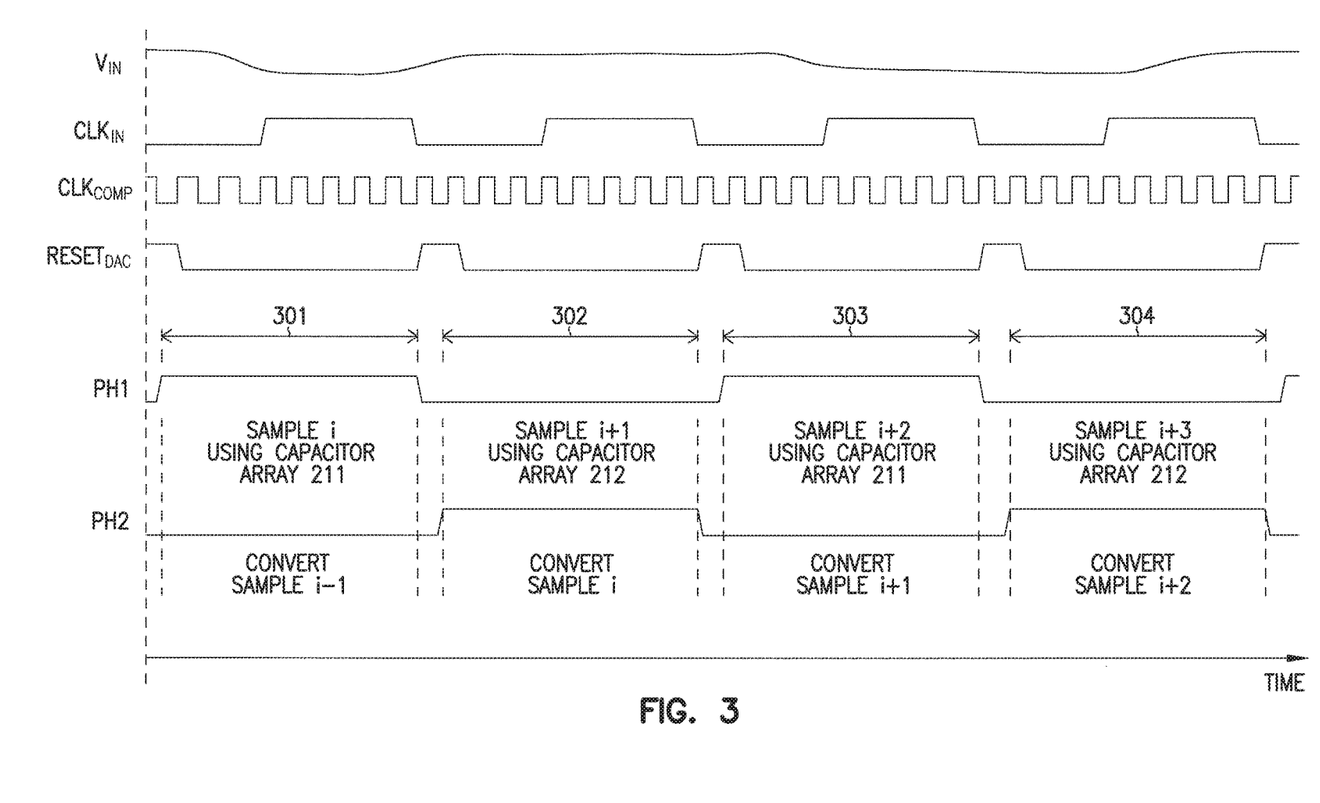
FIG. 3 shows an example timing diagram for some signals associated with the operations of the SAR ADC of FIG. 2, according to some embodiments described herein.

FIG. 3 shows an example timing diagram for some of the signals associated with the operations of SAR ADC 202 of FIG. 2, according to some embodiments described herein. For simplicity, the signals in FIG. 3 are shown in FIG. 2. As shown in FIG. 3, signal $V_{IN}$ can have different values (e.g., amplitude values) with respect to time. SAR ADC 202 (FIG.

2) can sample signal $V_{IN}$ (using capacitor array 211 and capacitor array 212) based on timing of a signal (a clock signal) $CLK_{IN}$. SAR ADC 202 can use comparators 221 through 226 to perform a conversion of each sample of signal $V_{IN}$. Each conversion may take multiple comparison cycles to complete. Each comparison cycle can be based on timing (e.g., a period) of a signal (a clock signal) $CLK_{COMP}$. For example, each comparison cycle can be performed within one period of signal $CLK_{COMP}$. In FIG. 3, signal $RESET_{DAC}$ may be used by SAR ADC 202 to reset DAC 255 and 256 between the end of a conversion of one sample of signal $V_{IN}$ and the start of a conversion of another sample of signal $V_{IN}$.

SAR ADC 202 can sample signal $V_{IN}$ in a sampling phase and convert samples of signal $V_{IN}$ based on timing (e.g., phases) of signals PH1 and PH2. Signals PH1 and PH2 are non-overlapping signals. SAR ADC 202 may control (e.g., turn on or turn off) switches S1 and S2 (FIG. 2) of capacitor arrays 211 and 212 based on timing of signals PH1 and PH2, respectively. Each of switches S1 can S2 can include a transistor (or multiple transistors). SAR ADC 202 may use signal PH1 (or a signal having a waveform similar to that of signal PH1) to control switches S1. SAR ADC 202 may use signal PH2 (or a signal having a waveform similar to that of signal PH2) to control switches S2. During operation of SAR ADC 202, since signals PH1 and PH2 are non-overlapping signals, switches S1 are turned off (e.g., open) when switches S2 are turned on (e.g., closed), and vice versa. For example, switches S1 and S2 can have opposite states (on and off) in each of time intervals 301, 302, 303, and 304 in FIG. 3. During time interval 301, switches S1 are turned on and switches S2 are turned off, and during time interval 302, switches S1 are turned off and switches S2 are turned on. This pattern can repeat for time intervals 303 and 304.

FIG. 3 also shows a time interleave of the sampling of signal $V_{IN}$ by capacitor arrays 211 and 212. For example, SAR ADC 202 can take a sample i of signal $V_{IN}$ at node 281 (shown in FIG. 2) during interval 301 using capacitor array 211, a sample i+1 of signal $V_{IN}$ at node 281 during interval 302 using capacitor array 212, a sample i+2 of signal $V_{IN}$ at node 281 during interval 303 using capacitor array 211, and a sample i+3 of signal $V_{IN}$ at node 281 during interval 304 using capacitor array 212. Thus, switches S1 and S2 can alternately couple capacitor arrays 211 and 212 to node 281 (forming a current path between node 281 and capacitor array 211 or 212) during sampling of signal $V_{IN}$ at node 281. This time interleave in the sampling of signal $V_{IN}$ allows SAR ADC 202 to take a sample (e.g., a present sample) of signal $V_{IN}$ while it converts another sample (e.g., a previous sample) of signal $V_{IN}$.

For example, as shown in FIG. 3, during time interval 301, SAR ADC 202 can convert sample i−1 (e.g., sampled before time interval 301 using capacitor array 212); during time interval 302, SAR ADC 202 can convert sample i (sampled during time interval 301); during time interval 303, SAR ADC 202 can convert sample i+1 (sampled during time interval 302); and during time interval 304, SAR ADC 202 can convert sample i+2 (sampled during time interval 303 using capacitor array 211). SAR ADC 202 can use comparators 221 through 226 for the conversion in each of time intervals 301, 302, 303, and 304. Thus, switches S1 and S2 can alternately couple capacitor arrays 211 and 212 to comparators 221 through 226 (forming current paths between nodes (e.g., input nodes) A, B, C, D, E, and F of comparators 221 through 226 and capacitor array 211 or 212) during a conversion phase of a sample of signal $V_{IN}$.

As shown in FIG. 2, capacitor arrays 211 and 212 can include the same number of capacitors (e.g., ten capacitors) and have the same capacitor arrangement and connections. The capacitance value of each capacitor in capacitor arrays 211 and 212 is based on an integer multiple of a unit capacitor (shown as $C_{UNIT}$). For example, the capacitor having label $5C_{UNIT}$ can have a capacitance value five times the capacitance value of the capacitor having label $C_{UNIT}$. The capacitor having label $4C_{UNIT}$ can have a capacitance value four times the capacitance value of the capacitor having label $C_{UNIT}$. The capacitor having label $3C_{UNIT}$ can have a capacitance value three times the capacitance value of the capacitor having label $C_{UNIT}$. And the capacitor having label $2C_{UNIT}$ can have a capacitance value two times the capacitance value of the capacitor having label $C_{UNIT}$. In FIG. 2, nodes A, B, C, D, E, and F at comparators 221 through 226, respectively, are the same as (e.g., are connected to) nodes A, B, C, D, E, and F at capacitor array 212. However, switches S1 and S2 of capacitor array 211 and capacitor array 212 are arranged and controlled (e.g., turned on and turned off), such that only one of capacitor array 211 and capacitor array 212 at a time can be used with comparators 221 through 226 for a conversion of a sample of $V_{IN}$.

SAR ADC 202 includes six comparators 221 through 226 that can operate to resolve at least two bits in each comparison cycle. Alternatively, three comparators can be used to resolve two bits in each comparison cycle. However, if an error occurs in a comparison cycle, such an error may remain in output information $D_{OUT}$. In FIG. 2, including six comparators 221 through 226 allows overlapped values between two comparison cycles for redundancy. This means that if an error occurs in a comparison cycle (e.g., the value of a sample of signal $V_{IN}$ is outside the range of a particular comparison cycle), such an error would be within the range of the next comparison cycle. Thus, in the next comparison cycle, the correct value of the input sample can be obtained. Therefore, using six comparators 221 through 226 (instead of three) to resolve two bits in each comparison cycle, comparators 221 through 226 may not need to be as accurate as some comparators in a conventional SAR ADC. This further improves (e.g., increase) the speed and improves (e.g., decrease) power consumption of SAR ADC 202.

SAR logic circuitry 230 can include registers and control logic to generate bits (presented as $D_{CONV}$) based on comparison results from comparators 221 through 226 during normal comparison cycles and additional (e.g., repeated) comparison cycles of a particular sample of signal $V_{IN}$. Then, as described in more detail below with reference to FIG. 5, digital reconstruction circuitry 240 can operate to generate information $D_{OUT}$ (e.g., final bits) based on information $D_{CONV}$. As shown in FIG. 2, SAR logic circuitry 230 can provide information FB (e.g., digital feedback information) to through path 231 summers 245 and 246 after each comparison cycle. Information FB has value based on the values of bits that are generated by SAR logic circuitry 230 after each comparison cycle.

Flash ADC 270 can operate to quantize signal $V_{IN}$ (e.g., compare the signals with reference signals) to provide quantized information based on the value of signal $V_{IN}$. SAR logic circuitry 230 can use the quantized information to further improve the speed of the comparison (e.g., the MSB) and help quickly resolve the MSB of the bits of each conversion. It may also help reduce voltages on sensitive nodes so that they may not exceed the supply voltage of SAR ADC 202. Flash ADC 270 can include a multi-bit resolution ADC. As an example, flash ADC 270 can include an X-level flash ADC (where X is equal to the number of comparators).

Step range circuitry 260 can operate to provide information STEP (e.g., digital information) to both summers 245 and 246. Information STEP has different values for different comparison cycles. The value of information STEP can be decreased by a quadratic factor from one comparison cycle to the next. For example, information STEP can have values of $xV_{REF}$ (where x can be 5/8), $x/4\ V_{REF}$, $x/16\ V_{REF}$, $x/64\ V_{REF}$, and so on, for $1^{st}$, $2^{nd}$, $3^{rd}$, $4^{th}$ comparison cycle, and so on. The value of voltage $V_{REF}$ is a known value based on the range (input range) of signal $V_{IN}$. Thus, the values of information STEP can be predetermined and stored in step range circuitry 260. As shown in FIG. 2, the value of information STEP can be added to the value of information FB (provided by SAR logic circuitry 230) and the result is provided to DAC 255. The value of information STEP can be subtracted from the value of information FB and the result is provided to DAC 256.

DAC 255 and DAC 256 can operate to generate voltages $V_H$ and $V_L$, respectively, based on the value received from respective summers 245 and 246. Voltages $V_H$ and $V_L$ can be used by SAR ADC 202 in the generation of the range of voltages for use in the interpolation of capacitor array 211 or 212 during each conversion cycle of a sample of signal $V_{IN}$. The values of voltages $V_H$ and $V_L$ can be different from one comparison cycle to the next comparison cycle. DAC 255 and DAC 256 can generate voltages $V_H$ and $V_L$, respectively, such that the values of voltages $V_H$ and $V_L$ can gradually converge to the value of a sample of signal $V_{IN}$ after each comparison cycle. DAC 255, DAC 256, and step range circuitry 260 can be reset after conversion of each sample of signal $V_{IN}$. Thus, for each conversion, the range of voltages for use in the interpolation of capacitor array 211 or 212 can be different or the same, depending on the value of signal $V_{IN}$.

Figure 4:
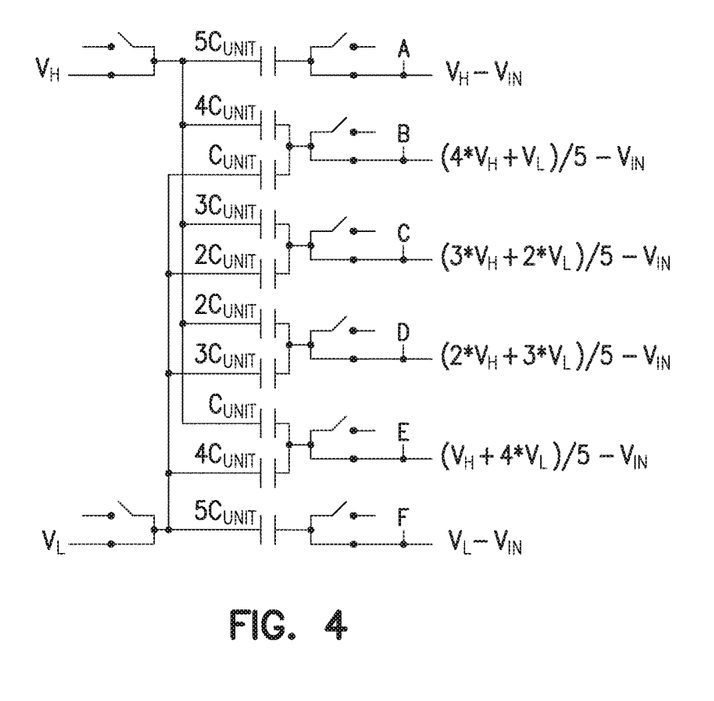
FIG. 4 shows a range of values at input nodes of comparators of the SAR ADC of FIG. 2 during a comparison cycle, according to some embodiments described herein.

FIG. 4 shows a range of values at nodes A, B, C, D, E, and F of comparators 221 through 226 during a comparison cycle, according to some embodiments described herein. As shown in FIG. 4, the range of voltage values can include six voltages based on six respective equations. $V_H - V_{IN}$; $(4*V_H + V_L)/5 - V_{IN}$; $(3*V_H + 2*V_L) - V_{IN}$; $(2*V_H + 3*V_L)/5 - V_{IN}$; $(V_H + 4*V_L)/5 - V_{IN}$; and $V_L - V_{IN}$. These equations are derived from the interpolation of each of capacitor arrays 211 and 212. As shown in FIG. 4, nodes A, B, C, D, E, and F of comparators 221 through 226 can get different input voltage levels. As mentioned above, the input levels are linearly spread around zero by interpolation of capacitor array 211 or 212. The voltage difference between two comparators 221 through 226 is the "deterministic LSB" and is designed to be in the order of the noise sigma. The linear spread of the input levels, as shown in FIG. 4, allows for simplicity in the reconstruction operation (described below) associated with each sample of signal $V_{IN}$.

Figure 5:
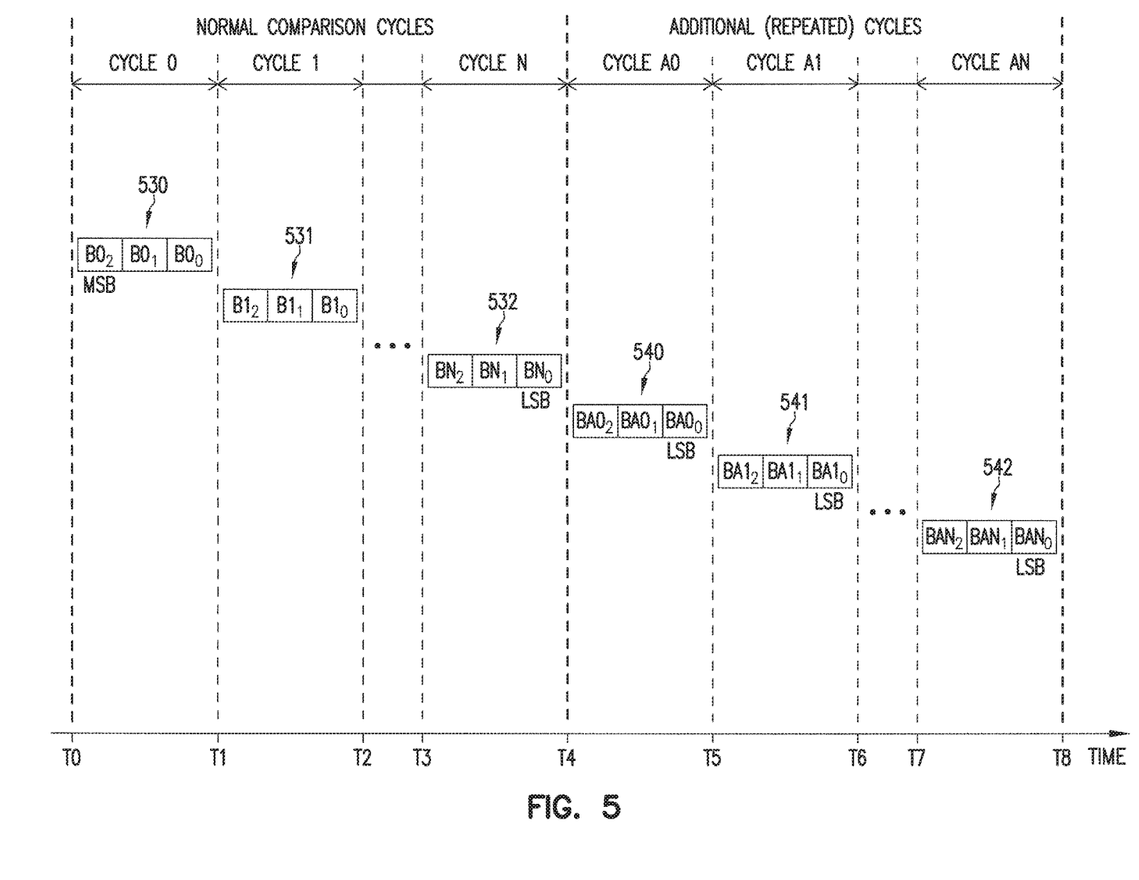
FIG. 5 shows a diagram including bits generated during normal comparison cycles and additional comparison cycles for a sample of an input signal, according to some embodiments described herein.

FIG. 5 shows a diagram including bits generated during normal comparison cycles and additional comparison cycles for a sample of input signal $V_{IN}$, according to some embodiments described herein. As shown in FIG. 5, times T0 through T8 are relative points in time. For example, time T0 occurs before time T1, time T1 occurs before time T2, and so on. SAR ADC 202 (e.g., using SAR logic circuitry 230 in FIG. 2) can generate bits during normal comparison cycles (e.g., cycle 0 through cycle N) between times T0 and T4 and bits during additional (e.g., repeated) comparison cycles (e.g., cycle A0 through cycle through cycle AN) between times T4 and T8. Based on the bits generated during normal comparison cycles and additional comparison cycles, SAR ADC 202 (e.g., using digital reconstruction circuitry 240) can perform an averaging operation on a portion (e.g., bits 532) of the bits generated during normal comparison cycles (between times T0 and T4) and bits 540, 541, and 542 generated during the additional comparison cycles (between times T4 and T8). After the averaging operation, SAR ADC can perform a reconstruction operation to generate output bits (e.g., bits presented as $D_{OUT}$ in FIG. 2). For example, SAR ADC 202 can generate the output bits by combining (e.g., adding) bits generated from the averaging operation with bits from another portion (e.g., a portion including bits 530 and 531) of the bits generated during normal comparison cycles For example, as shown in FIG. 5, during normal comparison cycles, SAR ADC 202 can operate to generate bits 530, 531, and 532 (e.g., normal bits). Bits 530 can include bits $B0_0$, $B0_1$, and $B0_2$ (where bit $B0_2$ can be the MSB). Bits 531 can include bits $B1_0$, $B1_1$, and $B1_2$, and bits 532 can include bits $BN_0$, $BN_1$, and $BN_2$ (where bit $BN_0$ can be the LSB). Thus bits $BN_0$, $BN_1$, and $BN_2$ are generated during in the last comparison cycle (e.g., cycle N) of the normal comparison cycles.

During additional comparison cycle A0 between times T4 and T5 (e.g., a first repeated comparison cycle), SAR ADC 202 can operate to generate bits 540, which includes bits $BA0_0$, $BA0_1$, and $BA0_2$. During the additional comparison cycle between times T5 and T6 (e.g., a second repeated comparison cycle), SAR ADC 202 can operate to generate bits 541, which includes bits $BA1_0$, $BA1_1$, and $BA1_2$. During the additional comparison cycle (between times T7 and T8 (e.g., a third repeated comparison cycle), SAR ADC 202 can operate to generate bits 542, which includes bits $BAN_0$, $BAN_1$, and $BAN_2$.

During the averaging operation (e.g., performed after time T8), SAR ADC 202 can perform a math operation on bits 532 (a portion of the bits generated during normal comparison cycles), 540, 541, and 542 (the bits (e.g., all of the bits) generated during additional comparison cycles). SAR ADC 202 may store bits 530, 531, 532, 540, 541, and 542 (generated between times T0 and T8) and retrieve the some of the stored bits (bits 532, 540, 541, and 542) for the averaging operation. In the averaging operation, SAR ADC 202 can calculate an average value of the values of bits 532, 540, 541, and 542 to generate bits (e.g., hereinafter called "averaging bits", not shown in FIG. 5). Thus, the averaging operation of SAR ADC 202 generates averaging bits that have a value based on a value of a portion (e.g., bits 532 in FIG. 5) of the bits generated during normal comparison cycles and values of bits (e.g., bits 540, 541, and 542 in FIG. 5) generated during additional comparison cycles.

SAR ADC 202 may generate bits 540, 541, and 542 (for use in the averaging operation) using an open loop fashion or a closed loop fashion. In the open fashion, path 231 (e.g., feedback path in FIG. 2) may not be used. SAR ADC 202 may use the same values at input nodes of comparators 221 through 226 (FIG. 2) that were used in the last normal comparison cycle (that generated bits $BN_0$, $BN_1$, and $BN_2$ of portion 531) and perform three different comparison cycles to generate respective bits 540, 541, and 542. Thus, in the open loop fashion, SAR ADC 202 may repeat the last normal comparison cycle three times in order to generates bits 540, 541, and 542 (FIG. 5). In the closed loop fashion, path 231 may be used, such that each of the additional comparison cycles used to generate bits 540, 541, and 542 can be similar to a normal comparison cycle. The closed loop fashion can provide more accurate results, and the open loop fashion can be faster. The values of bits 540, 541, and 542 in the open loop fashion may be different from the values of bits 540, 541, and 542 in the closed loop fashion.

Equations (1) and (2) below are two ways to calculate the average value $D_{AV}$ for the averaging bits during the averaging operation using either the open loop fashion (Equation (1)) or the closed loop fashion (Equation (2)). In equations (1) and (2), $D_N$, $D_{A0}$, $D_{A1}$, and $D_{AN}$ represent decimal values for bits 532, bits 540, bit 541, and 542, respectively.

$$D_{AV}=(D_N+D_{A0}+D_{A1}+\ldots D_{AN})/(N+2) \qquad (1)$$

$$D_{AV}=(N+2)*D_N+(N+1)*D_{A0}+N*D_{A1}+\ldots +D_{AN})/(N+2) \qquad (2)$$

After SAR ADC 202 generates the averaging bits, it generates output bits (e.g., $D_{OUT}$). Since the SNR associated with generation of bits (e.g., bits 530 and 531) from normal comparison cycle 0 through N−1 can be relatively small, SAR ADC can combine the averaging bits (bits having a value $D_{AV}$) with bits generated during normal comparison cycle 0 through N−1 to generate the output bits. Thus, the value of the output bits can be based on the value of the averaging bits and the values of the bits generated during normal comparison cycle 0 through N−1.

Equations (3) below shows a calculation for the output bits $D_{OUT}$. In equation (3), $D_0$, $D_1$, and $D_{N-1}$ represent decimal values for bits generated in cycle 0, cycle 1, and cycle (N−1), respectively, of the normal comparison cycles (FIG. 5)

$$D_{OUT}=D_{AV}+4*D_{(N-1)}+\ldots +4^{N-2}*D_1+4^{N-1}*D_0 \qquad (3)$$

SAR ADC 202 may perform any number additional comparison cycles. For example, may perform only one additional comparison cycle to generate bits 540 in FIG. 5 (without performing additional comparison cycles between times T5 and T8). Fewer comparison cycles may save time, while more comparison cycles may increase accuracy of output bits $D_{OUT}$.

Figure 6:
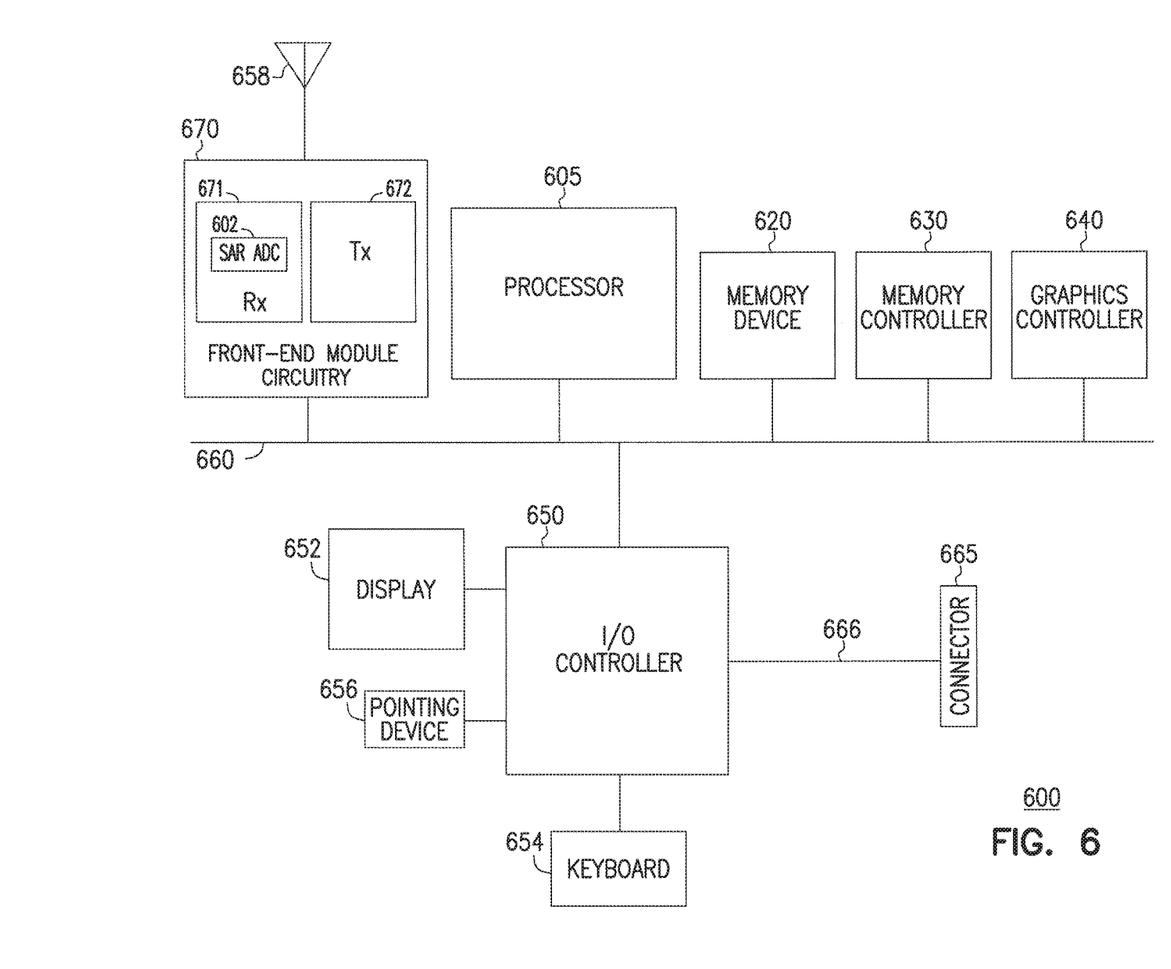
FIG. 6 shows an apparatus in the form of a system (e.g., electronic system), according to some embodiments described herein.

FIG. 6 shows an apparatus in the form of a system (e.g., electronic system) 600, according to some embodiments described herein. System 600 can include or be included in a computer, a tablet, a communication device (e.g., user equipment (LIE), a cellular phone, etc.), or other electronic devices or systems. As shown in FIG. 6, system 600 can include a processor 605, a memory device 620, a memory controller 630, a graphics controller 640, an input and output (I/O) controller 650, a display 652, a keyboard 654, a pointing device 656, at least one antenna 658, a bus 660, a connector 665, and a front-end module circuitry 670.

Each of processor 605, memory device 620, memory controller 630, graphics controller 640, and I/O controller 650 can include an integrated circuit (IC) chip. In some arrangements, system 600 does not have to include a display. Thus, display 652 can be omitted from system 600. In some arrangements, system 600 does not have to include any antenna. Thus, antenna 658 can be omitted from system 600. Processor 605 can include a general-purpose processor or an application specific integrated circuit (ASIC). Processor 605 can include a central processing unit (CPU).

Memory device 620 can include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 605. In an alternative arrangement, memory device 620 and processor 605 can be located on the same die (e.g., a semiconductor die). In such an alternative arrangement, memory device 620 is an embedded memory in processor 605, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through front-end module circuitry 670 and one or more antenna 658). Such wireless communication may include communication in accordance with Bluetooth communication technique, WiFi communication technique, WiGig communication technique, Long Term Evolution Advanced (LTE-A) communication technique, or other communication techniques.

I/O controller 650 can also include a module to allow system 600 to communicate with other devices or systems, in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), and other specifications.

Connector 665 can be arranged (e.g., can include terminals, such as pins) to allow system 600 to be coupled to an external device (or system). This may allow system 600 to communicate (e.g., exchange information) with such a device (or system) through connector 665. Connector 665 may be coupled to I/O controller 650 through a connection 666 (e.g., a bus). Connector 665, connection 666, and at least a portion of bus 660 can include conductive lines that conform with at least one of USB, DP, HDMI, Thunderbolt, PCIe, and other specifications.

Antenna 658 can include one or more directional or omnidirectional antennas, including, for example, dipole antennas, monopole antennas, patch antennas, loop antennas, microstrip antennas or other types of antennas suitable for transmission of RF signals.

Front-end module circuitry 670 can include a receiver (Rx) 671 and a transmitter (Tx) 672. Transmitter 672 can operate to transmit information from system 600 to an external device or system through antenna 658. Receiver 671 can operate to receive input information (e.g., analog input signals) from antenna 658. Receiver 671 can include an SAR ADC 602, which can include any of the SAR ADCs (e.g., SAR ADC 202) described above with reference to FIG. 2 through FIG. 5.

FIG. 6 shows the components of system 600 arranged separately from each other as an example. For example, each of processor 605, memory device 620, memory controller 630, graphics controller 640, I/O controller 650, and front-end module circuitry 670 can be located on a separate IC (e.g., semiconductor die or an IC chip). In some arrangements, two or more components (e.g., processor 605, memory device 620, graphics controller 640, 110 controller 650, and front-end module circuitry 670) of system 600 can be located on the same die (e.g., same IC chip) that forms a system-on-chip (SoC).

The illustrations of the apparatuses (e.g., SAR ADC 202, receiver 671, and system 600) and methods (e.g., operations of SAR ADC 202, receiver 671, and system 600) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including capacitor circuitry to sample a value of an input signal, comparators to compare the value of the input signal with a range of voltage values and provide comparison results, successive approximation register (SAR) logic circuitry to generate first bits and second bits based on the comparison results, and circuitry to calculate an average value of a value of the second bits and a value of bits of a first portion of the first bits, and to generate output bits representing the value of the input signal, the output bits including bits generated based on the average value.

In Example 2, the subject matter of Example 1 may optionally, include, wherein the circuitry is to combine bits generated based on the average value with bits of a second portion of the first bits to generate the output bits.

In Example 3, the subject matter of Example 1 or 2 may optional include, wherein the comparators are to provide the comparison results from comparison cycles, and the SAR logic circuitry is to generate at least two of the first bits based on each of the comparison cycles.

In Example 4, the subject matter of Example 1 or 2 may optionally, include, wherein the SAR logic circuitry is to generate the second bits after the first bits are generated.

In Example 5, the subject matter of Example 1 may optionally include, wherein the SAR logic circuitry is to generate the second bits based on at least at one of the comparison results from at least one comparison cycle performed by the comparators.

In Example 6, the subject matter of any of Examples 1-5 may optionally include, wherein the bits of the first portion of the first bits includes a least significant bit among the first bits.

In Example 7, the subject matter of any of Examples 1-5 may optionally include, wherein the bits of the second portion of the first bits includes a most significant, bit among the first bits.

Example 8 includes subject matter (such as a device, an electronic apparatus (e.g., circuit, electronic system, or both), or a machine) including an input node to receive an input signal, capacitor circuitry to sample a value of the input signal, a number of comparators to compare the value of the input signal with a range of voltage values during comparison cycles, and successive approximation register (SAR) logic circuitry to generate bits based on comparison results from the comparison cycles, wherein the number of comparators is greater than three, and the SAR logic circuitry is to generate at least two of the bits from each of the comparison cycles.

In Example 9, the subject matter of Example 8 may optionally include, further comprising switches, wherein the capacitor circuitry includes a first capacitor array and a second capacitor array, and the switches are to alternately couple the first capacitor array and the second capacitor array to the input node, and to alternately couple the first capacitor array and the second capacitor array to the number of comparators.

In Example 10, the subject matter of Example 9 may optionally include, further comprising a first digital-to-analog converter (DAC) and a second DAC, wherein the first DAC and the second DAC are to provide a range of voltages based on bits generated from SAR logic circuitry, and the range of voltages are based on the voltages from the first DAC and the second DAC.

In Example 11, the subject matter of Example 8 may optionally include, further comprising digital circuitry coupled to the SAR logic circuitry, wherein the SAR logic circuitry is to generate first bits of the bits and second bits of the bits, and the digital circuitry is to calculate an average value of a value of the second bits and a value of bits of a portion of the first bits, and to generate output bits representing the value of the input signal, the output bits including bits of a second portion of the first bits and bits generated based on the average value.

In Example 12, the subject matter of Example 11 may optionally include, wherein the SAR logic circuitry is to generate the second bits based on at least one of the comparison results from at least one comparison cycle performed by the comparators.

In Example 13, the subject matter of Example 8 may optionally include, wherein the comparators are to repeat at least one of the comparison cycles to provide at least one comparison result of the comparison results, and the SAR, logic circuitry is to generate the second bits based on the at least one comparison result.

Example 14 includes subject matter (such as a device, an electronic apparatus (e.g., circuit, electronic system, or both), or a machine) including a node, a first capacitor array, and first switches coupled between the node and the first capacitor array, a second capacitor array, and second switches coupled between the node and the second capacitor array, six comparators, third switches coupled between the six comparators and the first capacitor array, and fourth switches coupled between the six comparators and the second capacitor array, successive approximation register (SAR) logic circuitry coupled to the six comparators, a first digital-to-analog (DAC), fifth switches coupled between the first DAC and the first capacitor array, and sixth switches coupled between the first DAC and the second capacitor array, and a second DAC, seventh switches coupled between the second DAC and the first capacitor array, and eighth switches coupled between the second DAC and the second capacitor array.

In Example 15, the subject matter of Example 14 may optionally include, wherein the first and second capacitor arrays have a same number of capacitors.

In Example 16, the subject matter of Example 15 may optionally include, wherein more than two capacitors among the number of capacitors have different capacitance values.

In Example 17, the subject matter of Example 16 may optionally include, wherein each of the comparators includes an input node coupled to a ground node.

In Example 18, the subject matter of Example 14 may optionally include, further comprising a flash analog-to-digital coupled between the node and the SAR logic circuitry.

Example 19 includes subject matter (such as a device, an electronic apparatus (e.g., circuit, electronic system, or both), or a machine) including an antenna, and a receiver coupled to the antenna, the receiver including a successive approximation register (SAR) analog-to-digital converter (ADC), the SAR ADC including capacitor circuitry to sample a value of an input signal, comparators to compare the value of the input signal with a range of voltage values and provide comparison results, successive approximation register (SAR) logic circuitry to generate first bits and second bits based on the comparison results, and circuitry to calculate an average value of a value of the second bits and a value of bits of a portion of the first bits, and to generate output bits representing the value of the input signal, the output bits including bits generated based on the average value.

In Example 20, the subject matter of Example 19 may optionally include, wherein the comparators include more than three comparators.

In Example 21, the subject matter of Example 19 may optionally include, wherein the receiver is included in a front-end module circuitry of the apparatus.

In Example 22, the subject matter of Example 19 may optionally include, further comprising a connector coupled to the receiver, the connector conforming with one of Universal Serial Bus (USB), High-Definition Multimedia Interface (HDMI), Thunderbolt, and Peripheral Component Interconnect Express (PCIe) specifications.

Example 23 includes subject matter (such as a method of operating a device, an electronic apparatus (e.g., circuit, electronic system, or both), or a machine) including obtaining a sample of an input signal, comparing a value of the sample of the input signal with a range of voltages to provide comparison results, generating first bits and second bits based on the comparison results using a successive approximation register (SAR) logic circuitry, calculating an average value of a value of the second bits and a value of bits of a first portion of the first bits, generating additional bits based on the average value, and generating output bits, such that the output bits include bits of a second portion of the first bits and the additional bits.

In Example 24, the subject matter of Example 26 may optionally include, wherein comparing includes providing six different voltages of the range of voltages to comparators coupled to the SAR logic circuitry.

In Example 25, the subject matter of Example 26 or 27 may optionally include, wherein generating the first bits includes generating at least two of the first bits in each of comparison cycles that provide the comparison results.

In Example 26, the subject matter of Example 28 may optionally include, wherein obtaining the sample of the input signal includes alternating coupling a first capacitor array and a second capacitor array to a node providing the input signal.

In Example 27, the subject matter of Example 26 or 27 may optionally include, wherein a number of the second bits is equal to a number of the bits of the first portion of the first bits.

In Example 28, the subject matter of Example 28 may optionally include, wherein a number of the additional bits is equal to a number of the bits of the first portion of the first bits.

Example 29 includes subject matter (such as a device, an electronic apparatus (e.g., circuit, electronic system, or both), or machine) including means for performing any of the methods of claims 23-28.

The subject matter of Example 1 through Example 29 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

As used in this application and in the claims, a list of items joined by the term "at least one of" can mean any combination of the listed terms. For example, the phrase "at least one of A, B and C" can mean A; B; C; A and B; A and C; B and C; or A, B and C.

What is claimed is:

1. An apparatus comprising:
    capacitor circuitry to sample a value of an input signal, the capacitor circuitry including a first capacitor and a second capacitor;
    a plurality of comparators to compare the value of the input signal with a range of voltage values and provide comparison results, the comparators including a comparator;
    a first switch including a first terminal and a second terminal, the first terminal of the first switch coupled to a plate of the first capacitor, and the second terminal of the first switch coupled to an input node of the comparator;
    a second switch including a first terminal and a second terminal, the first terminal of the second switch coupled to a plate of the second capacitor, and the second terminal of the second switch coupled to the input node of the comparator;
    successive approximation register (SAR) logic circuitry to generate first bits and second bits based on the comparison results;
    circuitry to calculate an average value of a value of the second bits and a value of bits of a first portion of the first bits, and to generate output bits representing the value of the input signal, the output bits including bits generated based on the average value;
    a first digital-to-analog (DAC), first additional switches coupled between the first DAC and a first capacitor array of the capacitor circuitry, and second additional switches coupled between the first DAC and a second capacitor array of the capacitor circuitry; and
    a second DAC, third additional switches coupled between the second DAC and the first capacitor array, and fourth additional switches coupled between the second DAC and the second capacitor array.

2. The apparatus of claim 1, wherein the circuitry is to combine bits generated based on the average value with bits of a second portion of the first bits to generate the output bits.

3. The apparatus of claim 1, wherein the comparators are to provide the comparison results from comparison cycles, and the SAR logic circuitry is to generate at least two of the first bits based on each of the comparison cycles.

4. The apparatus of claim 1, wherein the SAR logic circuitry is to generate the second bits after the first bits are generated.

5. The apparatus of claim 1, wherein the SAR logic circuitry is to generate the second bits based on at least at one of the comparison results from at least one comparison cycle performed by the comparators.

6. The apparatus of claim 1, wherein the bits of the first portion of the first bits includes a least significant bit among the first bits.

7. The apparatus of claim 1, wherein the bits of the second portion of the first bits includes a most significant bit among the first bits.

8. An apparatus comprising:
an input node to receive an input signal;
capacitor circuitry to sample a value of the input signal;
a number of comparators to compare the value of the input signal with a range of voltage values during comparison cycles;
successive approximation register (SAR) logic circuitry to generate bits based on comparison results from the comparison cycles, wherein the number of comparators is greater than three, and the SAR logic circuitry is to generate at least two of the bits from each of the comparison cycles;
switches, wherein the capacitor circuitry includes a first capacitor array and a second capacitor array, and the switches are to alternately couple the first capacitor array and the second capacitor array to the input node, and to alternately couple the first capacitor array and the second capacitor array to the number of comparators;
a first digital-to-analog (DAC), first additional switches coupled between the first DAC and the first capacitor array, and second additional switches coupled between the first DAC and the second capacitor array; and
a second DAC third additional switches coupled between the second DAC and the first, capacitor array, and fourth additional switches coupled between the second DAC and the second capacitor array.

9. The apparatus of claim 8, wherein the first DAC and the second DAC are to provide a range of voltages based on bits generated from SAR logic circuitry, and the range of voltages are based on the voltages from the first DAC and the second DAC.

10. The apparatus of claim 8, further comprising digital circuitry coupled to the SAR logic circuitry, wherein the SAR logic circuitry is to generate first bits of the bits and second bits of the bits, and the digital circuitry is to calculate an average value of a value of the second bits and a value of bits of a portion of the first bits, and to generate output bits representing the value of the input signal, the output bits including bits of a second portion of the first bits and bits generated based on the average value.

11. The apparatus of claim 10, wherein the SAR logic circuitry is to generate the second bits based on at least one of the comparison results from at least one comparison cycle performed by the comparators.

12. The apparatus of claim 8, wherein the comparators are to repeat at least one of the comparison cycles to provide at least one comparison result of the comparison results, and the SAR logic circuitry is to generate the second bits based on the at least one comparison result.

13. An apparatus comprising:
a node;
a first capacitor array, and first switches coupled between the node and the first capacitor array;
a second capacitor array, and second switches coupled between the node and the second capacitor array;
six comparators, third switches coupled between the six comparators and the first capacitor array, and fourth switches coupled between the six comparators and the second capacitor array;
successive approximation register (SAR) logic circuitry coupled to the six comparators;
a first digital-to-analog (DAC); fifth switches coupled between the first DAC and the first capacitor array, and sixth switches coupled between the first DAC and the second capacitor array; and
a second DAC, seventh switches coupled between the second DAC and the first capacitor array, and eighth switches coupled between the second DAC and the second capacitor array.

14. The apparatus of claim 13, wherein the first and second capacitor arrays have a same number of capacitors.

15. The apparatus of claim 14, wherein more than two capacitors among the number of capacitors have different capacitance values.

16. The apparatus of claim 15, wherein each of the comparators includes an input node coupled to a ground node.

17. The apparatus of claim 13, further comprising a flash analog-to-digital coupled between the node and the SAR logic circuitry.

18. An apparatus comprising:
an antenna; and
a receiver coupled to the antenna, the receiver including a successive approximation register (SAR) analog-to-digital converter (ADC), the SAR ADC including:
capacitor circuitry to sample a value of an input signal, the capacitor circuitry including a first capacitor and a second capacitor;
comparators to compare the value of the input signal with a range of voltage values and provide comparison results, the comparators including a comparator;
a first switch including a first terminal and a second terminal, the first terminal of the first switch coupled to a plate of the first capacitor, and the second terminal of the first switch coupled to an input node of the comparator;
a second switch including a first terminal and a second terminal, the first terminal of the second switch coupled to a plate of the second capacitor, and the second terminal of the second switch coupled to the input node of the comparator;
successive approximation register (SAR) logic circuitry to generate first bits and second bits based on the comparison results;
circuitry to calculate an average value of a value of the second bits and a value of bits of a portion of the first bits, and to generate output bits representing the value of the input signal, the output bits including bits generated based on the average value;
a first digital-to-analog (DAC), first additional switches coupled between the first DAC and a first capacitor array of the capacitor circuitry, and second additional switches coupled between the first DAC and a second capacitor array of the capacitor circuitry; and a second DAC, third additional switches coupled between the second DAC and the first capacitor array, and fourth additional switches coupled between the second DAC and the second capacitor array.

19. The apparatus of claim 18, wherein the comparators include more than three comparators.

20. The apparatus of claim 18, wherein the receiver is included in a front-end module circuitry of the apparatus.

21. The apparatus of claim 18, further comprising a connector coupled to the receiver, the connector conforming with one of Universal Serial Bus (USB), High-Definition Multimedia Interface (HDMI), Thunderbolt, and Peripheral Component interconnect Express (PCIe) specifications.

* * * * *